(12) United States Patent
Ishikawa

(10) Patent No.: US 6,567,024 B1
(45) Date of Patent: May 20, 2003

(54) ANALOG SWITCH AND A/D CONVERTER HAVING THE SAME

(75) Inventor: Hirotaka Ishikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/697,742

(22) Filed: Oct. 26, 2000

(30) Foreign Application Priority Data

Oct. 27, 1999 (JP) .......................................... 11-305604

(51) Int. Cl.$^7$ ................................................ H03M 1/00
(52) U.S. Cl. ........................ 341/136; 327/534; 257/370
(58) Field of Search ................................. 341/136, 133, 341/122, 155, 156; 327/203, 210, 211, 214

(56) References Cited

U.S. PATENT DOCUMENTS

| | | | | |
|---|---|---|---|---|
| 4,529,897 A | * | 7/1985 | Suzuki et al. | ................ 307/571 |
| 5,684,422 A | * | 11/1997 | Witt et al. | .................. 327/261 |
| 5,689,257 A | * | 11/1997 | Mercer et al. | ............... 341/133 |
| 5,994,744 A | * | 11/1999 | Katayama et al. | .......... 257/370 |
| 6,194,952 B1 | * | 2/2001 | Shigehara | ................... 327/534 |

* cited by examiner

Primary Examiner—Brian Young
Assistant Examiner—John Nguyen
(74) Attorney, Agent, or Firm—Hayes Soloway PC

(57) ABSTRACT

An analog switch comprises a first transfer gate, a second transfer gate, an inverter and a transistor switch. The first transfer gate has the first input terminal and the first output terminal, and controls transmission of an input signal in accordance with a first control signal and a second control signal which is an inverse signal of the first control signal. The second transfer gate has the second input terminal and the second output terminal. The second input terminal of the second transfer gate is connected to the first output terminal. The second transfer gate controls transmission of an input signal which has passed the first transfer gate in accordance with the first control signal and the second control signal. The transfer gate has a first conductive-type first transistor which has a source connected to the first input terminal, a drain connected to the first output terminal, and a gate receiving the first control signal, and also a second conductive-type second transistor which has a source and a back gate both connected to the source of the first transistor, a drain connected to the drain of the first transistor, and a gate receiving the second control signal. The inverter and the transistor switch controls connection of the ground and a connection point of the first transfer gate and the second transfer gate, in accordance with a predetermined switch control signal. In particular, the inverter and the transistor switch controls the connection point to be grounded for a predetermined period, thereby to prevent the input signal which has passed the first transfer gate from flowing to the second transfer gate.

7 Claims, 4 Drawing Sheets

ANALOG SWITCH AND A/D CONVERTER HAVING THE SAME

BACKGROUND OF THE INVENTION

1. Field of the Invention

The present invention relates to an analog switch. The present invention also relates to an A/D converter with the analog switch.

2. Description of the Related Art

A plurality of analog switches are employed, for example, in a sample and hold circuit. The sample and hold circuit having a plurality of analog switches are used in such a structure where the circuit is connected, for example, to a successive approximation type A/D converter.

The sample and hold circuit samples a predetermined one of a plurality of analog input signals, and holds the signal for a predetermined period, and supplies the A/D converter with the signal.

Particularly, the plurality of input signals are sent to a plurality of analog switches, respectively. One of the plurality of analog switches operates in a mode wherein an input signal passes through the analog switch, thereby the input signal is sent to the A/D converter.

When the analog switch is in such a mode, the analog switch is said to be in a selective mode. On the contrary, when the analog switch operates in a mode wherein one input signal does not passes through the analog switch, the analog switch is said to be in a non-selective mode.

Likewise the structure of automobiles, in a structure where a source voltage largely varies and an input signal has substantially the same level as that of the source voltage, if the level of the input signal is larger than the level of the source voltage, the input signal may partially pass through the analog switch being in a non-selective mode. An injection current which may be caused by such an input signal partially passing through the switch has an effect on an input signal to be sent to the A/D converter, i.e., on an input voltage of the A/D converter.

In order to prevent occurrence of the injection current, an analog switch generally has two transfer gates in two stages of an input stage and an output stage. In addition, there is included a transistor switch for controlling a connection point of the transfer gates to be grounded when the analog switch is in a non-selective mode. Further, the potential of the back gate (substrate electrode) of an N-channel MOS transistor, included in one transfer gate as an input stage, is set to the same as that of an input signal.

Having thus formed the analog switch, the analog switch has the large circuitry structure for preventing the occurrence of an injection current.

FIG. 4 is a circuitry diagram showing a general analog switch wherein an injection current is prevented from occurring.

As illustrated in FIG. 4, the analog switch comprises transfer gates 100 and 200, inverters 4, 5 and 600, and a transistor (N-channel MOS transistor) N31.

The transfer gates 100 and 200 is cascade-connected with each other between an input terminal TI and an output terminal TO. A connection point of the transfer gates 100 and 200 is denoted by X1.

The transfer gate 100 includes transistors (N-channel MOS transistors) N101, N102, N103, N104 and transistors (P-channel MOS transistors) P101, P102 and P103.

The sources of the transistors N101 and P101 are connected with each other, the sources of the N102 and P102 are connected with each other, and the sources of the N103 and P103 are connected with each other. The drains of the transistors N101 and P101 are connected with each other, the drains of the N102 and P102 are connected with each other, and the drains of the N103 and P103 are connected with each other.

The sources of the transistors N101 and P101 are connected to the input terminal TI, and the drains thereof are connected to the connection point X1. The source of the transistors N102 and P102 are connected to the source of the transistors N103 and P103, and the drains thereof are connected to the input terminal TI. The sources of the transistors N103 and P103 are connected to the source of the transistors N102 and P102, and the drains thereof are connected to the connection point X1.

The gates of the transistors N101, N102 and N103 are connected with each other, and receive a sampling control signal C. The gates of the transistors P101, P102 and P103 are connected with each other, and receive a sampling control signal CB.

Furthermore, the back gates of the transistors N101, N102, N103 are connected to the sources of the transistors N102 and P102 (or the source of the transistors N103 and P103). The back gates of the transistors P101, P102 and P103 are connected to the power supply.

The gate of the transistor N104 is connected to the gates of the transistors P101, P102, P103, the source of the transistor N104 is grounded, and the drain thereof is connected to the source of the transistors N102 and P102 (or the source of the transistors N103 and P103).

The transfer gate 200 includes transistors (N-channel MOS transistors) N201, N202, N203, N204, and transistors (P-channel MOS transistors) P201, P202 and P203.

The sources of the transistors N201 and P201 are connected with each other. The sources of the transistors N202 and P202 are connected with each other. The sources of the transistors N203 and P203 are connected with each other. The drains of the transistors N201 and P201 are connected with each other. The drains of the transistors N202 and P202 are connected with each other. The drains of the transistors N203 and P203 are connected with each other.

The sources of the transistors N201 and P201 are connected to the connection point X1, whereas the drains thereof are connected to the output terminal TO. The sources of the transistors N202 and P202 are connected to the sources of the transistors N203 and P203, while the drains thereof are connected to the connection point X1. The sources of the transistors N203 and P203 are connected to the sources of the transistors N202 and P202, while the drains thereof are connected to the output terminal TO.

The gates of the transistors N201, N202 and N203 are connected with each other, and receive a sampling control signal C. The gates of the transistors P201, P202 and P203 are connected with each other, and receive a sampling control signal CB.

The back gates of the transistors N201, N202 and N203 are connected to the sources of the transistors N202 and P202 (or the sources of the transistors N203 and P203). The back gates of the transistors P201, P202 and P203 are connected to the power source.

The gate of the transistor N204 is connected to the gates of the transistors P201, P202 and P203, the source of the transistor N204 is grounded, and the drain thereof is connected to the sources of the transistors N202 and P202 (or the sources of the transistors N203 and P203).

The inverter 4 supplies the gate of the transistor N31 with a pull-down control signal PD for controlling the connection of the connection point X1 and the ground, in accordance with a select signal S. The inverter 4 includes a transistor (N-channel MOS transistor) N41 and a transistor (P-channel MOS transistor) P41.

The gates of the transistors N41 and P41 are connected with each other, and receive a select signal S. The drains of the transistors N41 and P41 are connected with each other, and connected to the gate of the transistor N31. The source of the transistor N41 is grounded, whereas the source of the transistor P41 is connected to the power source.

The inverters 5 and 600 supply the transfer gates 100 and 200 with complementary sampling control signals C and CB, in accordance with a sampling signal SA.

The inverter 5 includes a transistor (N-channel MOS transistor) N51 and a transistor (P-channel MOS transistor) P51. The gates of the transistors N51 and P51 are connected with each other, and receive a sampling signal SA. The drains of the transistors N51 and P51 are connected with each other, and connected to the transfer gates 100 and 200 and the inverter 600. The source of the transistor N51 is grounded, whereas the source of the transistor P51 is connected to the power source.

The inverter 600 includes a transistor (N-channel MOS transistor) N601 and a transistor (P-channel MOS transistor) P601.

The gates of the transistors N601 and P601 are connected with each other, and connected to the drains of the transistors N51 and P51. The drains of the transistors N601 and P601 are connected with each other, and connected to the transfer gates 100 and 200. The source of the transistor N601 is grounded, while the source of the transistor P601 is connected to the power source.

The transistor N31 includes a gate connected to the inverter 4, a grounded source and a drain connected to the connection point X1. Upon reception of a high level pull-down control signal PD from the inverter 4, the transistor N31 controls the connection point X1 to be grounded. Upon reception of a low level pull-down control signal PD, the transistor N31 disconnects the connection point X1 from the ground.

Operations of the analog switch illustrated in FIG. 4 will now be described.

When the select signal S is at a high level, the analog switch is in a selective mode.

In response to the high level select signal S, the inverter 4 supplies the gate of the transistor N31 with a low level pull-down control signal PD. Then, the transistor N31 is OFF, and the connection point X1 is disconnected from the ground.

In the state where the connection point X1 is disconnected from the ground, if the sampling signal SA is at a high level, the inverter 5 sends a low level sampling control signal CB to the transfer gates 100 and 200 and the inverter 600 sends a high level sampling control signal C thereto. After this, the transistors N101, P101, N201 and P201 are ON, and the transfer gates 100 and 200 are in conduction mode. Thus, an input signal IN to be sent to the input terminal TI is output as an output signal OUT from an output terminal TO via the transfer gates 100 and 200.

The transistors N104 and N204 are OFF, and the transistors N102, P102, N103, P103, N202, P202, N203 and P203 are ON. Then, the back gate of the transistor N101 is connected to the input terminal TI, whereas the back gate of the transistor N201 is connected to the connection point X1. Hence, the potential of the back gates of the transistors N101 and N201 is equal to the potential of the input signal IN.

On the contrary, when the select signal S is at a low level, the analog switch is in a non-selective mode.

In response to the low level select signal S, the inverter 4 supplies the gate of the transistor N31 with a high level pull-down control signal PD. Then, the transistor N31 is ON, and the connection point X1 is grounded. In this structure, even if the input signal IN passes through the transfer gate 100, it will not flow to the transfer gate 200. That is, any injection current has no effect on the output signal OUT.

As explained above, the transistors N102, P102, N103 and P103 of the transfer gate 100 and the transistors N202, P202 N203 and P203 of the transfer gate 200 are necessarily included in the switch gate, in order to prevent any injection current having an effect on a signal. However such transistors have nothing to do with the essential operations of the analog switch.

Accordingly, the general analog switch, wherein the occurrence of an injection current having an effect on the output signal is prevented, includes a number of transistors, thus have complicated circuitry structure.

SUMMARY OF THE INVENTION

It is accordingly an object of the present invention to provide an analog switch with the simple circuitry structure.

Another object thereof is to provide an A/D converter employing an analog switch with the simple circuitry structure.

In order to achieve the above objects, an analog switch according to the first aspect of the present invention may comprise:

a first transfer gate which has a first input terminal and a first output terminal and controls transmission of an input signal in accordance with a first control signal and a second control signal which is an inverse signal of the first control signal; and a second transfer gate which has a second input terminal and a second output terminal, the second input terminal being connected to the first output terminal, and which controls transmission of an input signal which has passed the first transfer gate, in accordance with the first control signal and the second control signal, and wherein the first transfer gate may include:

a first conductive-type first transistor which has a source connected to the first input terminal, a drain connected to the first output terminal, and a gate receiving the first control signal; and a second conductive-type second transistor which has a source and a back gate both connected to the source of the first transistor, a drain connected to the drain of the first transistor, and a receiving the second control signal.

According to this invention, an analog switch with the simple circuitry structure can be realized.

The second transfer gate may comprise:

a first conductive-type third transistor which has a source connected to the second input terminal, a drain connected to the second output terminal, and a gate receiving the first control signal: and a second conductive-type fourth transistor which has a source connected to the source of the third transistor, a drain connected to the drain of the third transistor, and a gate receiving the second control signal.

The analog switch may further comprise a switch circuit which controls connection of a ground and a connection point of the first transfer gate and the second transfer gate, in accordance with a predetermined switch control signal, and wherein the switch circuit may control the connection point to be grounded for a predetermined period, so that the input signal which has passed the first transfer gate is prevented from flowing to the second transfer gate.

The switch circuit may include a second conductive-type fifth transistor which has a drain connected to the connection point, a grounded source, and a gate receiving the switch control signal.

The fourth transistor may include a back gate; and the back gate of the fourth transistor may be connected to the drain of the fourth transistor.

Each of the first transistor and the third transistor may be a P-channel MOS transistor; and each of the second transistor and the fourth transistor may be an N-channel MOS transistor.

An A/D converter according to the second aspect of the present invention may comprise:

a sample and hold unit which samples and holds one of an "N" (N is a positive integer) number of analog signals and outputs the signal as a sampled and held signal; and a converter unit which converts the sampled and held signal into "M" bit (M is a positive integer) digital signals, and wherein:

the sample and hold unit may include an "N" number of analog switches, each having an output terminal connected with one another, for selecting a target analog signal to be sampled and held; and a capacitor, one end of which is connected to output terminals of the "N" number of analog switches and other end of which is grounded, and which samples and holds an analog signal selected by the analog switches and outputs the analog signal as the sampled and held signal;

each of the analog switches may include a first transfer gate which has a first input terminal and a first output terminal and controls transmission of the analog signal in accordance with a first control signal and a second control signal which is an inverse signal of the first control signal, a second transfer gate which has a second input terminal and a second output terminal, the second input terminal being connected to the first output terminal, and which controls transmission of an analog signal which has passed the first transfer gate, in accordance with the first control signal and the second control signal, and a switch circuit which controls connection of a ground and a connection point of the first transfer gate and the second transfer gate, in accordance with a predetermined switch control signal, and controls the connection pint to be grounded while the capacitor holds an analog signal, thereby to prevent the analog signal which has passed the first transfer gate from flowing to the second transfer gate; and the first transfer gate may include a first conductive-type first transistor which has a source connected to the first input terminal, a drain connected to the first output terminal, and a gate receiving the first control signal, and a second conductive-type second transistor which has a source and a back gate both connected to the source of the first transistor, a drain connected to the drain of the transistor, and a gate receiving the second control signal.

The second transfer gate may include:

a first conductive-type third transistor which has a source connected to the second input terminal, a drain connected to the second output terminal, and a gate receiving the first control signal; and a second conductive-type fourth transistor which has a source connected to the source of the third transistor, a drain connected to the drain of the third transistor, and a gate receiving the second control signal.

The fourth transistor may includes a back gate; and the back gate of the fourth transistor may be connected to the drain of the fourth transistor.

Each of the first transistor and the third transistor may be a P-channel MOS transistor; and each of the second transistor and the fourth transistor may be an N-channel MOS transistor.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

An analog switch according to the first embodiment of the present invention will now be explained with reference to the accompanying drawings.

Figure 1:
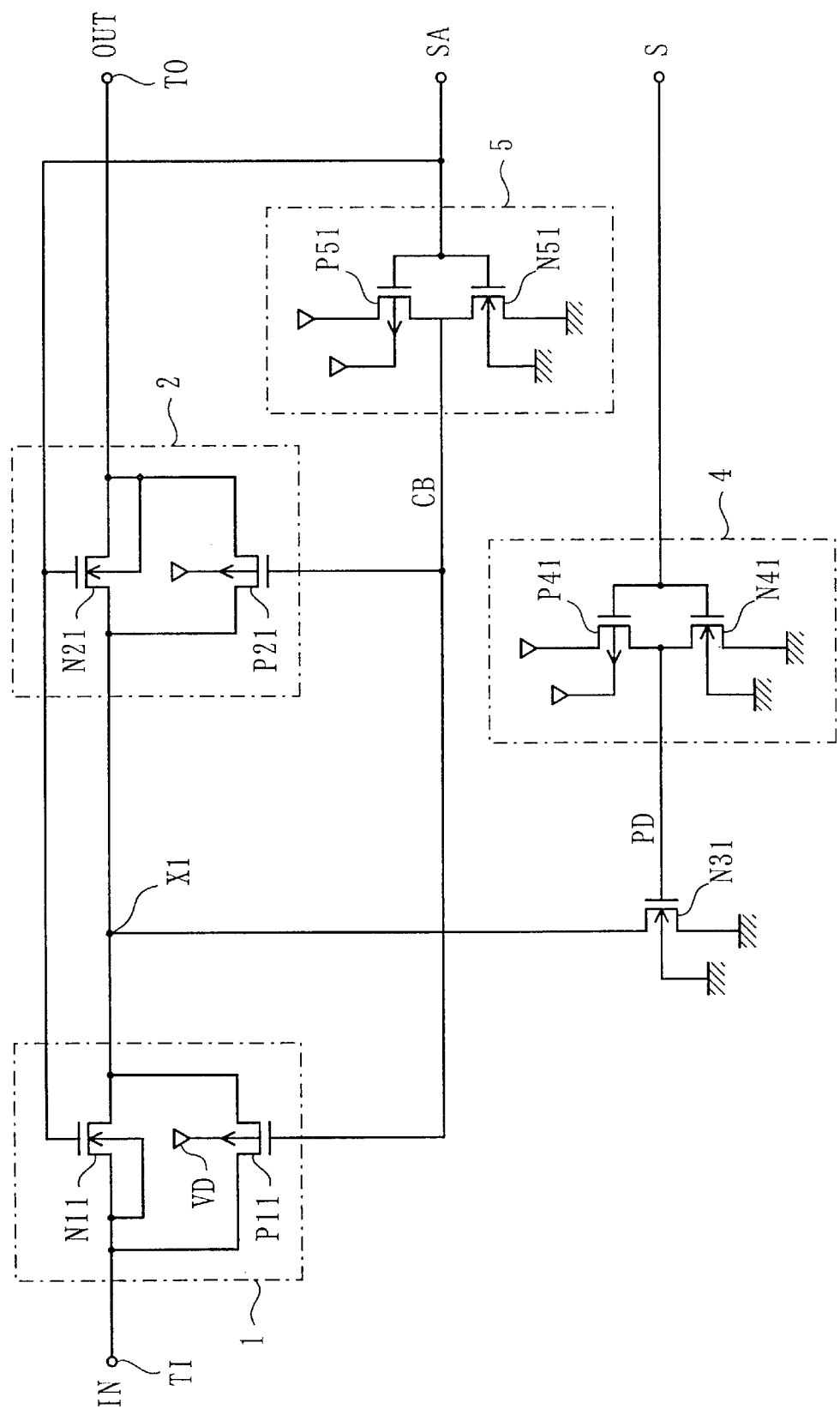
FIG. 1 is a circuitry diagram showing an analog switch according to the first embodiment of the present invention.

The analog switch according to the first embodiment comprises, as shown in FIG. 1, transfer gates 1 and 2, inverters 4 and 5, and a transistor (N-channel MOS transistor) N31.

The transfer gates 1 and 2 are cascade-connected with each other between an input terminal TI and an output terminal TO. Reference numeral X1 denotes a connection point of the transfer gates 1 and 2.

The transfer gate 1 includes a transistor (N-channel MOS transistor) N11 and a transistor (P-channel MOS transistor) P11.

The transfer gate 2 includes a transistor (N-channel MOS transistor) N21 and a transistor (P-channel MOS transistor) P21.

The gates of the transistors N11 and N21 are connected with each other, and receive a sampling signal SA which is to be supplied thereto. The gates of the transistors P11 and P21 are also connected with each other, and receive a sampling signal CB which is to be supplied thereto.

The sources of the transistors N11 and P11 are connected with each other, and the drains thereof are also connected with each other. The sources of the transistors N11 and P11 are connected to the input terminal TI, whereas the drains thereof are connected to the connection point X1. The back gate of the transistor N11 is connected to the input terminal TI (source), whereas the back gate of the transistor P11 is connected to a power source VD. In such a structure where the back gate of the transistor N11 is connected to the source, a threshold voltage of the transistor N11 can be stable, and a transient current will not flow to the back gate (substrate) of the transistor N11. Generally, a transient current is one flowing to and throughout the substrate so that the PN conjunction which has a function as a capacitor can be charged or discharged.

The sources of the transistors N21 and P21 are connected with each other, and the drains thereof are also connected with each other. The sources of the transistors N21 and P21 are connected to the connection point X1, whereas the drains thereof are connected to the output terminal TO. The back gate of the transistor N21 is connected to the output terminal TO (drain), while the back gate of the transistor P21 is connected to the power source VD. In such a structure where the back gate of the transistor N21 is connected to the output terminal TO, a threshold voltage of the transistor N21 can be stable, and a transient current will not flow to the back gate (substrate).

The inverter 4 supplies the gate of the transistor N31 with a pull-down control signal PD for controlling the connection of the connection point X1 and the ground, in accordance with a select signal S.

The inverter 4 includes a transistor (N-channel MOS transistor) N41 and a transistor (P-channel MOS transistor) P41.

The gates of the transistor N41 and P41 are connected with each other, and the drains thereof are also connected with each other. The source of the transistor N41 is grounded, while the source of the transistor P41 is connected to the power source VD. A select signal S is sent to the gates of the respective transistors N41 and P41. The pull-down control signal PD in accordance with the select signal S is sent from the drains of the transistors N41 and P41 to the gate of the transistor N31. Particularly, when the select signal S is a at high level, a pull-down control signal PD at a low level is sent to the gate of the transistor N31. On the contrary, when the select signal S is at a low level, a pull-down control signal PD at a high level is sent to the gate of the transistor N31.

The inverter 5 supplies the transfer gates 1 and 2 with a sampling control signal CB for controlling conduction of the transfer gates 1 and 2, in accordance with a sampling signal SA.

The inverter 5 includes a transistor (N-channel MOS transistor) N51 and a transistor (P-channel MOS transistor) P51.

The gates of the transistors N51 and P51 are connected with each other, and the drains thereof are also connected with each other. The source of the transistor N51 is grounded, while the source of the transistor P51 is connected to the power source VD. The sampling signal SA is sent to the gates of the transistors N51 and P51. Sampling control signals CB in accordance with this sampling signal SA are sent respectively from the drains of the transistors N51 and P51 to the gates of the transistors P11 and P21. Particularly, in a case where the sampling signal SA is at a high level, the sampling control signal CB at a low level is sent to the gates of the transistors P11 and P21. On the contrary, in a case where the sampling signal SA is at a low level, the sampling control signal CB at a high level is sent to the gates of the transistors P11 and P21.

The transistor N31 includes a drain connected to the connection point X1, a grounded source, and a gate connected to the inverter 4. The transistor N31 connects the connection point X1 with the ground and disconnects the connection point X1 from the ground, in accordance with a pull-down control signal PD sent from the inverter 4. In particular, the transistor N31 connects the connection point X1 with the ground upon reception of a pull-down control signal PD at a high level, and disconnects the connection point X1 from the ground upon reception of a pull-down control signal PD at a low level.

Operations of the analog switch having the so-far described structure will now be described.

Figure 2:
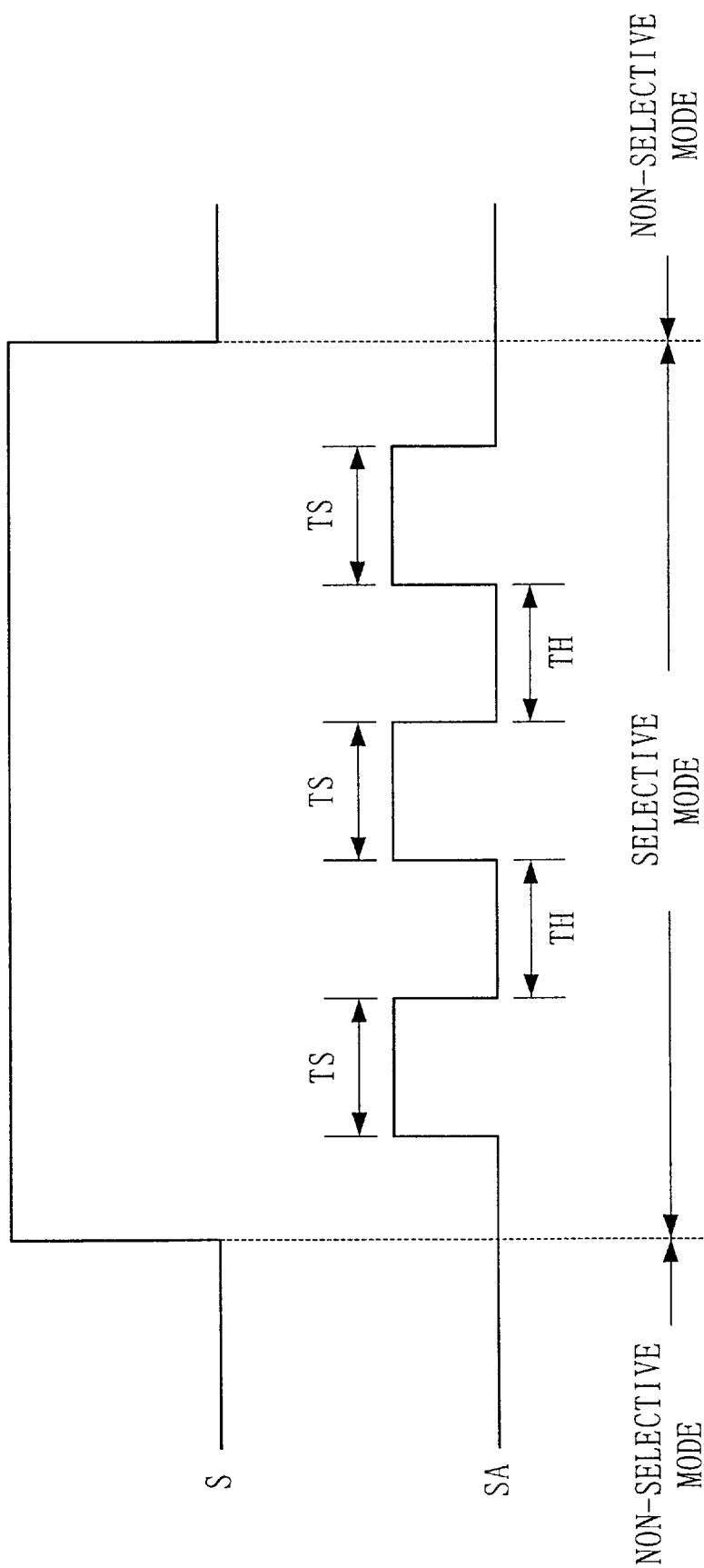
FIG. 2 is a timing chart showing the relationship between a select signal and a sampling signal which are to be sent to the analog switch of FIG. 1.

FIG. 2 is a timing chart showing the relationship between a select signal S and a sampling signal SA.

When a select signal S sent to the inverter 4 is at a high level, the analog switch is in a selective mode.

The inverter 4 supplies the gate of the transistor N31 with a pull-down control signal PD at a low level, in response to the select signal S at a high level. After this, the transistor N31 is OFF, and the connection point X1 is disconnected from the ground. Hence, the potential of a signal to be input to the transfer gate 2 is the same potential of a signal output from the transfer gate 1.

When a sampling signal SA is at a high level in the above state, the transistors N11 and N21 are ON. The inverter 5 supplies the gates of the transistors P11 and P21 with a sampling control signal CB at a low level. Upon reception of the sampling control signal CB, the transistors P11 and P21 are ON. That is, the transfer gates 1 and 2 are in a conduction mode. An analog input signal IN to be sent to the input terminal TI is output as an output signal OUT from the output terminal TO via the transfer gates 1 and 2. This input signal IN is thus output during a sample period TS.

When a sampling signal SA is at a low level, the transistors N11 and N21 are OFF. The inverter 5 supplies the gates of the respective transistors P11 and P21 with a sampling control signal CB at a high level. Then, the transistors P11 and P21 are OFF. Hence, the transfer gates 1 and 2 are closed, thus preventing the analog input signal IN to be sent to the input terminal TI from passing throughout the transfer gates 1 and 2. The transfer gates 1 and 2 are thus closed during a holding period TH.

On the contrary, when a select signal S to be sent to the inverter 4 is at a low level, the analog switch of this embodiment is in a non-selective mode.

The inverter 4 supplies the gate of the transistor N31 with a pull-down control signal PD at a high level, in response to reception of the select signal S at a low level. After this, the transistor N31 is ON, and the connection point X1 is grounded. Hence, the potential of the connection point X1 is now at the earth potential, and the potential of a signal to be input to the transfer gate 2 is also at the earth potential.

As explained above, in the case where the analog switch is in a non-selective mode, the connection point X1 is grounded. Accordingly, even if the transfer gates 1 and 2 are in a conduction mode, an input IN to be sent to the input terminal TI flows to the ground via the transistor N31, and does not flow to the output terminal TO.

As explained, the back gate of the transistor N11 is connected to the input terminal TI, while the back gate of the transistor N21 is connected to the output terminal TO. Thus, as will be described later, the threshold voltage of the transistors N11 and N21 is stable, and preventing any transient current from flowing to those back gates.

Generally, a MOS transistor is a device having four terminals of drain, gate, source and back gate (substrate terminal).

Generally speaking, even if the drain potential VD, the gate potential Vg, and the source potential Vs are stable, any variation in the potential of the back gate has an effect on the operations of the transistor. This is so-called a back gate bias effect.

In many cases, the potential of the back gate is fixed to the earth potential. However, in the case where the drain potential VD, the gate potential Vg and the source potential Vs varies with respect to the earth potential, the characteristics of the transistor changes. Even if the relationship among the drain potential VD, the gate potential Vg and the source potential Vs remains the same, as long as those potentials vary with respect to the earth potential, the characteristics of the transistor changes.

If the drain potential VD, the gate potential Vg and the source potential Vs vary, a value of a voltage to be applied to the PN conjunction changes. Thus, a transient current for charging/discharging the PN conjunction (capacitor) flows to the back gate. When a transient current flows to the back gate, the potential of the back gate varies, thus bringing a significant effect on the characteristics of the transistor.

The threshold voltage VT of a MOS transistor can be expressed by the following equation:

$$VT = VT0 + (tG/\epsilon G) \cdot (2 \cdot q \cdot \epsilon S \cdot N)^{1/2} \cdot \{(2\phi F + VBS)^{1/2} - (2\phi F)^{1/2}\} \quad (1)$$

A reference symbol VT0 denotes the threshold voltage of the MOS transistor when the bias voltage between the source and the back gate is 0V. A reference symbol tG denotes the thickness of the gate oxide film, a reference symbol $\epsilon G$ denotes the permittivity of the gate oxide film, and a reference symbol $\epsilon S$ denotes the permittivity of silicon. In addition, a reference symbol q denotes the amount of electron charge. A reference symbol N denotes the impurity concentration of the substrate. A reference symbol VBS denotes the bias potential (hereinafter referred to as back gate bias potential) between the source and the back gate. A reference symbol $\phi F$ denotes a Fermi level.

ON resistance R of MOS transistors can be expressed by the following equation:

$$R = K/(VGS - VT) \quad (2)$$

A reference symbol denotes the bias voltage between the gate and the source, whereas a symbol K denotes a coefficient.

As obvious from the equation (1), the larger the back gate bias voltage VBS, the larger the threshold voltage VT. In addition, as obvious from the equation (2), the larger the threshold voltage VT, the larger the ON resistance R.

A P-channel MOS transistor to be employed in a general transfer gate is formed in an N-type semiconductor substrate, while an N-channel MOS transistor is formed in a P-well area which is formed in the N-type semiconductor substrate using a diffusion technique.

The impurity concentration of the P-well area is larger than the impurity concentration of the N-type semiconductor substrate. Thus, the threshold voltage of the N-channel MOS transistor is, generally speaking three times, larger than the threshold voltage of the P-channel MOS transistor, in terms of the sensitivity with respect to the back gate bias voltage VBS. In other words, when the back gate bias voltage VBS varies, a variation in the threshold voltage of the N-channel MOS transistor is much larger than a variation in the threshold voltage of the P-channel MOS transistor.

Accordingly, for the N-channel MOS transistor, the back gate bias effect needs to satisfactorily be reduced.

As described above, in the first embodiment, the back gate of the N-channel MOS transistor N11 forming the transfer gate 1 is connected to the input terminal TI, i.e., the source. In this structure, the potential of the back gate is the same as the source potential, and the back gate bias voltage VBS is 0V. As a result of this, the threshold voltage VT of the N-channel MOS transistor N11 is retained at a constant value.

For example, when the analog switch is in a non-selective mode, the transistor N11 may be ON. Even in such a case, the threshold voltage of the transistor N11 is retained at a constant value, and any transient current is prevented from occurring.

The back gate of the N-channel MOS transistor N21 included in the transfer gate 2 is, as described above, connected to the output terminal TO of the analog switch of this embodiment, i.e., the drain. In this structure, the potential of the back gate thereof is the same as that of the drain. If the transistor N21 is ON in the case where the analog switch is in a non-selective mode, the source of the transistor N21 is grounded, thereby a back gate bias voltage VSB is approximately 0V. In other words, the potential of the back gate is substantially the same as that of the source. According to this structure, the threshold voltage of the transistor N21 is retained at a constant value, and preventing any transient current from occurring.

As described above, in the case where the analog switch is in a non-selective mode, not only the connection point X1 is grounded, but also the back gate of the transistor N11 in the transfer gate 1 is connected to the source of the transistor N11, and also the back gate of the transistor N21 in the transfer gate 2 is connected to the drain of the transistor N21. Having thus simply formed the structure of the analog switch, the threshold voltage of the transistor N11 and the N21 is retained at an almost constant value, any transient current is prevented from occurring, and the input signal IN to be supplied in a non-selective mode is prevented from flowing to the output terminal TO. Because the threshold voltage is retained at a constant value, the analog switch can stably be operated.

A successive approximation A/D converter according to the second embodiment of the present invention will now be described with reference to the accompanying drawings.

Figure 3:
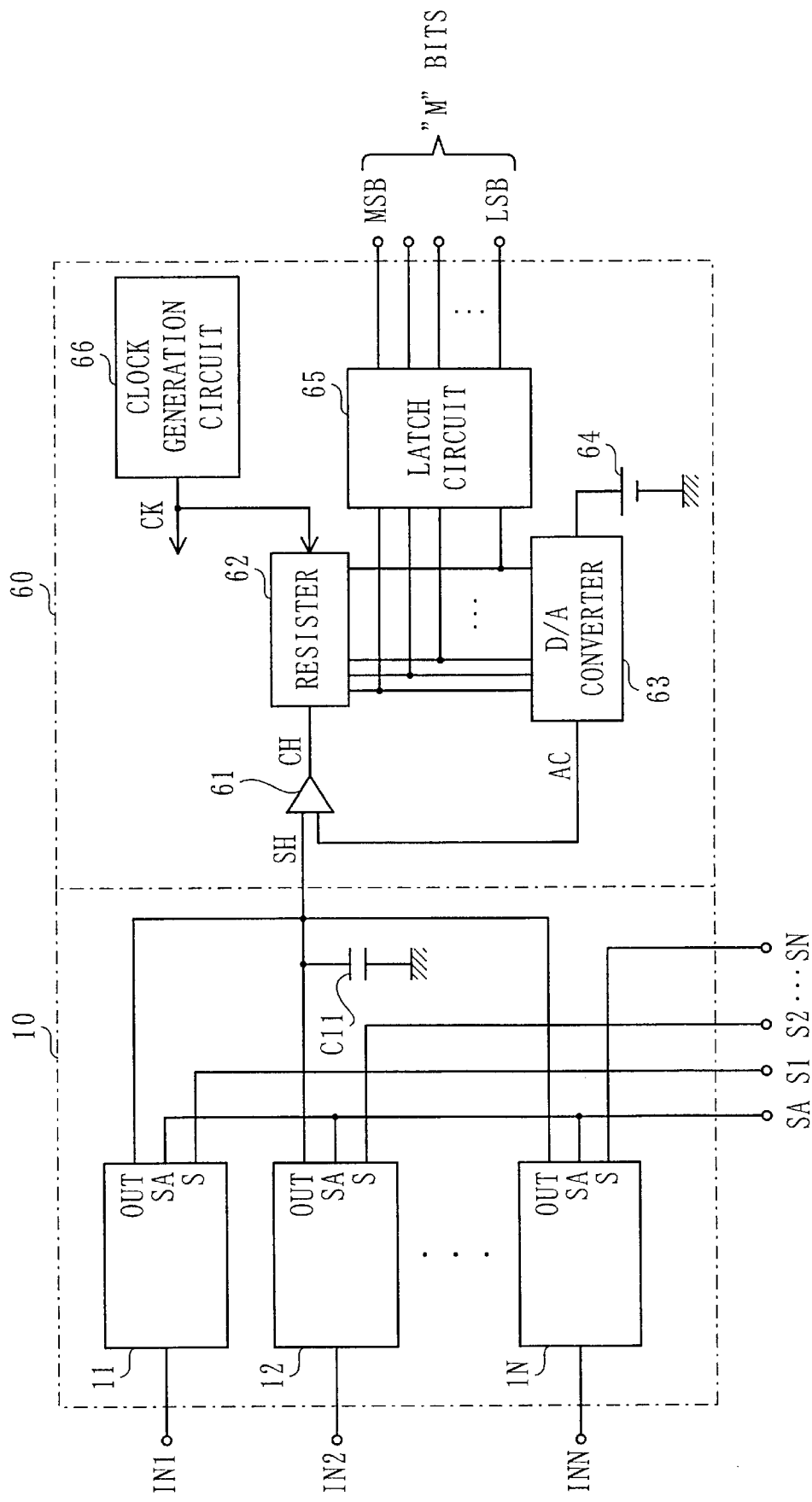
FIG. 3 is a block diagram showing the structure of a successive approximation type A/D (analog to digital) converter according to the second embodiment of the present invention.
Figure 4:
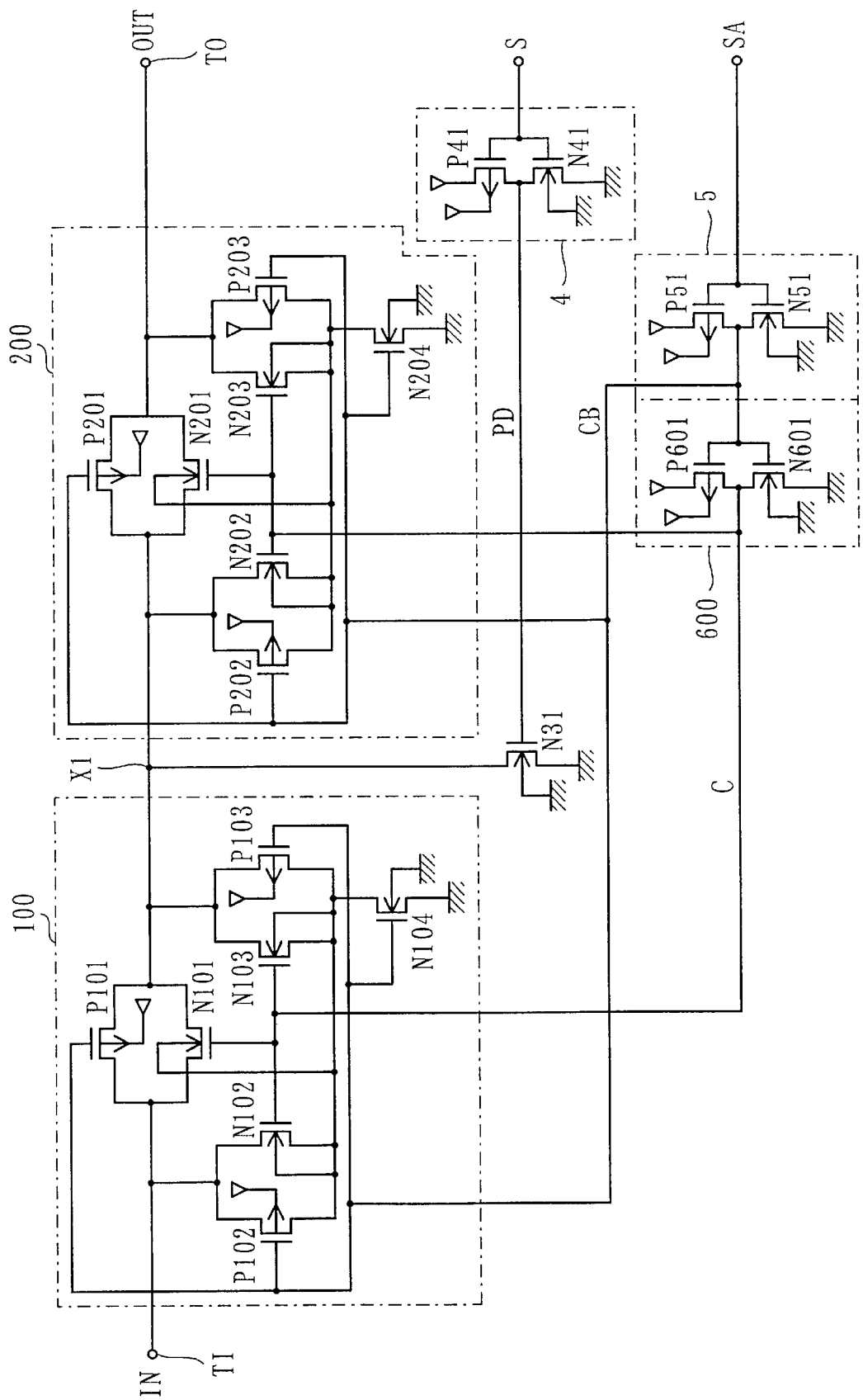
FIG. 4 is a circuitry diagram showing a general analog switch.

The A/D converter according to the second embodiment includes the analog switch of the first embodiment. Particularly, as shown in FIG. 3, the A/D converter comprises a sample and hold circuit 10 and a converter circuit 60.

An "N" number of input signals IN1, IN2, . . . , INN are sent to the sample and hold circuit 10. Upon reception of the input signals, the sample and hold circuit 10 samples and holds a certain input signal of the "N" number of input signals IN1, IN2, . . . , INN, and supplies the converter circuit 60 with the input signal as a sampled and held signal SH. The sample and hold circuit 10 comprises an "N" number of analog switches 11, 12, . . . , 1N, and a capacitor C11.

Each of the analog switches 11, 12, . . . , 1N has substantially the same structure as that of the analog switch according to the first embodiment. The analog switches 11, 12, ..., 1N operate in accordance with a sampling signal SA, and select signals S1, S2 ..., SN, respectively. In more particular, one of the analog switches 11, 12, ..., 1N is in a conduction mode, and one corresponding input signal of the input signals IN1, IN2, ..., INN is sent to the capacitor C11 via the analog switch.

The capacitor C11 is charged upon reception of the input signal from the one of the analog switches 11, 12, ..., 1N. After this, the capacitor C11 samples and holds the input signal from the one of the analog switches 11, 12, ..., 1N. The charged capacitor C11 supplies the converter circuit 60 with a sampled and held signal SH having about the same level as that of the received input signal.

The converter circuit 60 is well known as a successive approximation type A/D converter. The converter circuit 60 comprises a comparator 61, a resistor 62, an "M" bit D/A converter 63, a reference voltage source 64, a latch circuit 65, and a clock generation circuit 66.

The comparator 61 compares the level of the sampled and held signal SH sent from the sample and hold circuit 10 with a level of an output signal AC of the D/A converter 63. The comparator 61 then outputs to the register 62 the result of the comparison as a comparison result signal CH.

The register 62 stores the comparison result signal CH sent from the comparator 61, and outputs "M" bit signals to the D/A converter 63.

The D/A converter 63 outputs to the comparator 61 an output voltage AC having an level according to a value of the "M" bit signals sent from the register 62.

The reference voltage source 64 supplies the D/A converter 63 with a reference voltage for operating the D/A converter 63.

The latch circuit 65 holds the "M" bit signals output by the register 62, and outputs "M" bit parallel signals having the same value as the above "M" bit signals.

The clock generation circuit 66 supplies each of the circuits included in the converter circuit 60 a clock CK necessary for operations of the circuits.

Operations of the successive approximation type A/D converter having thus formed structure will now be explained.

The above A/D converter is employed in such a structure where the A/D converter is connected to, for example, a non-illustrative signal generation circuit and a signal processing circuit, etc.

The signal generation circuit generates input signals IN1, IN2, ..., INN to be sent to the sample and hold circuit 10, a sampling signal SA and select signals S1, S2, ..., SN, in accordance with a predetermined program, etc. The signal generation circuit does not set more than two of the select signals S1, S2, ..., SN to a high level at the same time. In other words, only one of the select signals S1, S2, ..., SN is a high level signal.

The signal processing circuit carries out a predetermined process using the "M" bit parallel signals output by the A/D converter.

The input signals IN1, IN2, ..., INN and the select signals S1, S2, ..., SN are sent to the analog switches 11, 12, ..., 1N included in the sample and hold circuit 10 from the signal generation circuit. In particular, the input signal IN1 and the select signal S1 are sent to the analog switch 11, the input signal IN2 and the select signal S2 are sent to the analog switch 12, and the input signal INN and the select signal SN are sent to the analog switch 1N.

As explained above, only one of the select signals S1, S2, ..., SN is a high level signal. The select signal S1 will now be explained as a high level signal by way of example.

Upon reception of the select signal S1, the analog switch 11 is in a selective mode. Particularly, the inverter 4 of the analog switch 11 supplies the gate of the transistor N31 with a pull-down control signal PD at a low level. After this, the transistor N31 is OFF, and the connection point X1 is disconnected from the ground.

On the contrary, upon reception of the select signals S2, ..., SN, the respective analog switches 12, ..., 1N are in a non-selective mode. Particularly, the inverter 4 of each of the analog switches 12, ..., 1N supplies the gate of the transistor N31 with a pull-down control signal PD at a high level. After this, the transistor N31 is ON, and the connection point X1 is grounded. Thus, even if the sampling signal SA is at a high level, the input signals IN2, ..., INN to be sent to the respective analog switches 12, ..., IN will not be sent to the converter circuit 60, for the same reasons explained in the first embodiment. Therefore, the sampled and held signal SH to be sent to the converter circuit 60 remains as is without any effect from the input signals IN2, ..., INN.

When the sampling signal SA generated by the signal generation circuit is at a high level, the analog switch 11 in a selective mode is in a conduction mode in the same manner as described in the first embodiment. Then, the input signal IN1 is sent to the capacitor C11 via the analog switch 11.

The capacitor C11 is charged upon reception of the input signal IN1, during this sample period TS. Having being charged, the capacitor C11 supplies the converter circuit 60 with a sampled and held signal SH having the same level as that of the input signal IN1.

When the sampling signal SA sent by the signal generation circuit is at a low level, the analog switch 11 is not in a conduction mode, unlike in the first embodiment. Hence, the input signal IN1 will not be sent to the capacitor C11 and the converter circuit 60 any more.

The capacitor C11 is discharged during this holding period TH, thereby the capacitor C11 keeps supplying the converter circuit 60 with a sampled and held signal SH having the same level as that of the input signal IN1.

The comparator 61 of the converter circuit 60 compares a sampled and held signal SH sent from the sample and hold circuit 10 with an output voltage AC of the D/A converter 63.

The register 62 and the D/A converter 63 operate synchronously with the comparator 61 in response to a clock CK sent from the clock generation circuit 66.

In particular, immediately before the comparator 61 begins the comparison operation, the register 62 outputs to the D/A converter 63 an "M" bit signals of a preset value. Those "M" bit signals includes a bit value of 1 in the position of the most significant digit, i.e., the most significant bit is the "M"-th bit.

The D/A converter 63 outputs to the comparator 61 an output voltage AC having a level corresponding to the value of the "M" bit signals sent from the register 62. The level of the output voltage AC corresponding to the value of the "M" bit signals (e.g., 100 ... 00) is one half of the most highest level of the sampled and held signal SH which is equivalent to the most highest level ML of an input signal to be input to the comparator 61.

The comparator 61 compares the level of the sampled and held signal SH to be sent from the sample and hold circuit 10 with the level (ML/2) of the output voltage AC sent from the D/A converter 63.

In the case where the level of the sampled and held signal SH>ML/2 (i.e., the level of the sampled and held signal SH is larger than the level of the output voltage AC), the comparator 61 outputs a comparison result signal CH at a high level to the register 62.

In response to this comparison result signal CH, the register 62 retains the high level "M"-th bit signal, i.e., retains the signal as is. Then, the register 62 sets the bit value of the "M−1"-th bit signal to 1, and outputs the "M" bit signals (110 . . . 00) to the D/A converter 63.

In the case where the level of the sampled and held signal SH<ML/2 (i.e., the level of the sampled and held signal SH is smaller than the level of the output voltage AC), the comparator 61 outputs to the register 62 the comparison result signal CH at a low level.

In response to the comparison result signal CH, the register 62 sets the bit value of the "M"-th bit to a low level, i.e., to 0 (zero). Then, the register 62 sets the bit value of the "M−1"-th bit to 1, and outputs the "M" bit signals (010 . . . 00) to the D/A converter 63.

Accordingly, the process for comparing the level of the sampled and held signal SH with the level of the output voltage AC, with respect to the "M-th" bit within the "M" bit signals.

In the same manner, the comparator 61, the register 62 and the D/A converter 63 carries out the comparison process, with respect to those bits up to the least significant bit within the "M" bit signals, thereby to determine the bit value of each bit signal. Having performed the comparison processes, an analog input signal IN1 is converted into "M" bit digital signals.

Those bits which are settled according to the comparison processes are sequentially stored in the latch circuit 65.

The latch circuit 65 outputs to the non-illustrative signal processing circuit "M" bit parallel signals at a predetermined timing, with a clock CK sent from the clock generation circuit 66.

The signal processing circuit carries out a predetermined process using the "M" bit parallel signals from the converter circuit 60.

As described above, A/D converter has the analog switches having the same structure as that described in the first embodiment. Hence, a selected input signal can be converted into digital signals without any effect from a non-selected input signal. As suggested in the first embodiment, the analog switch has the simple circuitry structure, thus achieving a small size of the A/D converter.

In the above second embodiment, the explanations have been made to the case where the input signal IN1 is converted into "M" bit parallel signals. The same can be applied to the input signals IN2, . . . , INN.

Various embodiments and changes may be made thereonto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. H11-305604 filed on Oct. 27, 1999, and including specification, claims, drawings and summary. The disclosure of the above Japanese Patent Application is incorporated herein by reference in its entirety.

What is claimed is:

1. A analog switch comprising:
    a first transfer gate which has a first input terminal and a first output terminal and controls transmission of an input signal in accordance with a first control signal and a second control signal which is an inverse signal of the first control signal; and
    a second transfer gate which has a second input terminal and a second output terminal, the second input terminal being connected to the first output terminal, and which controls transmission of an input signal which has passed said first transfer gate, in accordance with the first control signal and the second control signal, and
    wherein said first transfer gate includes:
        a first conductive-type first transistor which has a source connected to the first input terminal, a drain connected to the first output terminal, and a gate receiving the first control signal; and
        a second conductive-type second transistor which has a source and a back gate both connected to the source of said first transistor, a drain connected to the drain of said first transistor, and a gate receiving the second control signal; and
    wherein said second transfer gate comprises:
        a first conductive-type third transistor which has a source connected to the second input terminal, a drain connected to the second output terminal, and a gate receiving the first control signal; and
        a second conductive-type fourth transistor which has a source connected to the source of said third transistor, a drain connected to the drain of the third transistor, and a gate receiving the second control signal.

2. The analog switch according to claim 1, further comprising a switch circuit which controls connection of a ground and a connection point of said first transfer gate and said second transfer gate, in accordance with a predetermined switch control signal, and
    wherein said switch circuit controls the connection point to be grounded for a predetermined period, so that the input signal which has passed said first transfer gate is prevented from flowing to said second transfer gate.

3. The analog switch according to claim 2, wherein said switch circuit includes a second conductive-type fifth transistor which has a drain connected to the connection point, a grounded source, and a gate receiving the switch control signal.

4. The analog switch according to claim 2, wherein:
    said fourth transistor includes a back gate; and
    the back gate of said fourth transistor is connected to the drain of said fourth transistor.

5. The analog switch according to claim 4, wherein:
    each of said first transistor and said third transistor is a P-channel MOS transistor; and
    each of said second transistor and said fourth transistor is an N-channel MOS transistor.

6. An analog switch comprising:
    a first transfer gate which has a first input terminal and a first output terminal, and controls transmission of an input signal in accordance with a first control signal and second control signal; and
    a second transfer gate which has a second input terminal and a second output terminal, said second input terminal connected to said first output terminal, and controls transmission of an input signal which has passed said first transfer gate, in accordance with said first control signal and said second control signal, and
    wherein said first transfer gate includes:
        a first transistor of a first conductivity type coupled between said first input terminal and said first output terminal, and said first transistor having a gate receiving said first control signal; and a second transistor of a second conductivity type coupled between said first input terminal and said first output terminal, and said second transistor having a gate receiving said second control signal, and a back gate coupled to said first input terminal; and, said second transfer gate includes:

a third transistor of said first conductivity type coupled between said second input terminal and said second output terminal, and said third transistor having a gate receiving said first control signal; and a fourth transistor of said second conductivity type coupled between said second input terminal and said second output terminal, and said fourth transistor having a gate receiving said second control signal, and a back gate coupled to said second output terminal.

7. The analog switch as claimed in claim 6, and further comprising a fifth transistor coupled between said first output terminal and a power supply line.

* * * * *